(12) United States Patent
Huber et al.

(10) Patent No.: US 6,605,968 B2
(45) Date of Patent: *Aug. 12, 2003

(54) GATE COUPLED VOLTAGE SUPPORT FOR AN OUTPUT DRIVER CIRCUIT

(75) Inventors: Brian W. Huber, Allen, TX (US); David Lisenbe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/218,258

(22) Filed: Aug. 13, 2002

(65) Prior Publication Data

US 2003/0001631 A1 Jan. 2, 2003

Related U.S. Application Data

(63) Continuation of application No. 09/977,661, filed on Oct. 15, 2001, now Pat. No. 6,433,593, which is a continuation of application No. 09/633,925, filed on Aug. 8, 2000, now Pat. No. 6,351,159.

(51) Int. Cl.[7] .................. H03K 3/00; H03K 17/687
(52) U.S. Cl. .................. 327/108; 327/111; 327/434
(58) Field of Search .................. 327/108, 111, 327/112, 170, 427, 434; 326/86

(56) References Cited

U.S. PATENT DOCUMENTS

| | | | |
|---|---|---|---|
| 3,992,703 A | 11/1976 | Luisi et al. | 340/173 R |
| 4,796,174 A | 1/1989 | Nadd | 327/530 |
| 5,537,070 A | 7/1996 | Risinger | 327/170 |
| 5,680,071 A | 10/1997 | Senoh et al. | 327/111 |
| 6,018,256 A | 1/2000 | Kumagai et al. | 327/112 |
| 6,049,483 A | 4/2000 | Schreck et al. | 365/185.27 |
| 6,075,391 A | 6/2000 | Tarantola et al. | 327/111 |
| 6,121,803 A | 9/2000 | Tanaka | 327/142 |
| 6,351,157 B1 | 2/2002 | Sharpe-Geisler | 327/112 |
| 6,433,593 B1 * | 8/2002 | Huber et al. | 327/108 |

* cited by examiner

Primary Examiner—Toan Tran
(74) Attorney, Agent, or Firm—TraskBritt

(57) ABSTRACT

A method and apparatus for supporting a voltage in an output driver circuit and smoothing the response of the voltage to switching operations in the output driver circuit. A capacitive element, such as a capacitor or transistor, is coupled to the gate of a drive transistor in an output driver leg circuit of an output driver and to a switched signal voltage. By coupling the capacitive element to a signal voltage other than ground, a smaller capacitive element is required than that required for coupling the capacitive element to ground. An embodiment of the invention further includes a plurality of capacitive elements configured such that the voltage support is applied to the gate of the drive transistor in phases rather than all at once to smooth voltage response to drive transistor switching. Transistors having relatively longer effective channel lengths may be used as the capacitive elements to allow for additional phasing-in of the voltage support due to signal delay through the longer channels.

13 Claims, 4 Drawing Sheets

GATE COUPLED VOLTAGE SUPPORT FOR AN OUTPUT DRIVER CIRCUIT

CROSS-REFERENCE TO RELATED APPLICATIONS

This application is a continuation of application Ser. No. 09/977,661, filed Oct. 15, 2001, now U.S. Pat. No. 6,433,593, issued Aug. 13, 2002, which is a continuation of application Ser. No. 09/633,925, filed Aug. 8, 2000, now U.S. Pat. No. 6,351,159 B1, issued Feb. 26, 2002.

BACKGROUND OF THE INVENTION

1. Field of the Invention

The present invention relates generally to voltage compensation techniques in an output driver for an integrated circuit. More particularly, the present invention relates to coupling a capacitive element between a drive transistor's gate and a power supply and phasing-in portions of a voltage-supporting capacitance at slightly different times to smooth the compensating corrections.

2. State of the Art

As the sizes of semiconductor devices have reduced, so have the power supply voltages driving the devices. With smaller power supply voltages, respective signals within the semiconductor devices have also become smaller and more susceptible to variance caused by the influence of resistance, inductance, capacitance and switching within the semiconductor device. Unintended variances on a signal line can lead to an inability to correctly detect a signal and to detecting a signal when one was not intended. In either case, malfunctions and other signal errors may occur as a result of the variances.

As shown in FIG. 1, an output 2 of a semiconductor device conventionally includes an output driver 4 between the primary semiconductor circuitry 6 and the outputs 2. One purpose of the output driver 4 is to provide sufficient power compensation for the output signal to ensure the signal is output with an appropriate signal strength.

FIG. 2 shows a conventional output driver circuit 8. For a conventional semiconductor die, each output of the die is coupled to each of constant voltage signal lines envg<0> through envg<6> 10, 12, 14, 16, 18, 20 and 22. Each of the constant voltage signal lines envg<0> through envg<6> 10, 12, 14, 16, 18, 20 and 22 is further coupled to at least one output driver leg circuit 24, 26, 28, 30, 32, 34, 36, 38, 40, 42 and 44. Using one of the output driver leg circuits 44 coupled to envg<6> 22 as an example, each output driver leg circuit conventionally includes a drive transistor 46 and a switching transistor 48.

The output driver circuit 8 shown in FIG. 2 is configured as an open-drain output driver. An open-drain configured output driver is one in which the drain of the drive transistor for each output driver leg circuit 24, 26, 28, 30, 32, 34, 36, 40, 42 and 44 is not coupled to circuitry within the semiconductor, but is directly coupled to an externally accessible contact, such as a bond pad. In a conventional open-drain configured output driver circuit 8 that has its output impedance controlled, such as that shown in FIG. 2, the drive transistor 46 will have its gate 50 set to a controlled voltage (typically 1.3 V to 1.4 V) such that the drive transistor 46 will be in saturation as much as possible while still achieving the required output drive. The switching transistor 48 is placed between the drive transistor 46 and a reference potential 53 such as a ground, to allow for switching the drive transistor 46 between off and on states.

The array of output driver leg circuits 24, 26, 28, 30, 32, 34, 36, 38, 40, 42 and 44 are conventionally configured such that the transistors used for the output driver leg circuits 32 and 40 coupled to constant voltage signal line envg<5> 20 are approximately half the physical size of the transistors used for the output driver leg circuits 34 and 44 coupled to constant voltage signal line envg<6> 22. Likewise, the transistors used for the output driver leg circuits 30 and 38 coupled to envg<4> 18 are approximately half the physical size of the transistors used for the output driver leg circuits 32 and 40 coupled to constant voltage signal line envg<5> 20. This pattern of using transistors approximately half the physical size of the transistors coupled to the next sequential envg< > signal line continues down to the transistors coupled to envg<0> 10. The physical size of the output driver leg circuit 42 is half the sum of the physical sizes of both output driver leg circuits 28 and 36. The output drive supplied by an output driver leg circuit is proportional to the physical size of the transistors used for that output driver leg circuit. By including output driver leg circuits, each providing a different output drive amount, a combination of different output driver leg circuits can provide a wide range of available output drive. Additional circuitry well-known to those of ordinary skill in the art determines how much output drive is needed for a particular output signal and controls which output driver leg circuits are switched "ON" and "OFF" to provide an appropriate level of output drive.

Though there are many advantages to selectively switching the various output driver leg circuits 24, 26, 28, 30, 32, 34, 36, 38, 40, 42 and 44 "ON" and "OFF," the "ON" and "OFF" action causes undesirable shifts in the drive transistor's gate 50 voltage due to potential changes that couple back through the drive transistor's gate 50. Namely, the drive transistor's gate voltage may drop 100 mV from its desired level, for example, when the drive transistor 46 is switched to an "ON" state which will reduce the output drive from its intended target. One method of compensating for this drop in voltage, as shown in FIG. 3, is to couple a capacitor 54 between the drive transistor's gate 58 and a ground potential. With the capacitor in place, when the drive transistor 56 is turned "ON" indirectly by the switching transistor 62, the voltage on the drive transistor's gate 58 begins to drop toward a ground potential, but the capacitor 54, also referenced to the ground potential, reduces the voltage drop experienced. The larger the capacitor 54 used, the smaller the voltage dip caused when the drive transistor 56 is turned on. One example of a support circuit having capacitive support of this kind used in an output driver circuit may be found in Rambus Dynamic Random Access Memory (RDRAM) part 288MD-400-800, designed by Rambus, Inc. of Mountain View, Calif.

The repeated "ON"—"OFF" action, with the voltage on the drive transistor's gate 58 working to remain constant over a period of time, results in a square wave signal at the drive transistor's gate 58. The output driver leg circuits' control circuit then tries to set the DC average of the drive transistor's gate 58 voltage equal to the desired voltage. As an example, using the output driver leg circuit of FIG. 3, if constant voltage signal lines envg<6> 60 were set at an operating voltage of 1.4 V and the switching transistor 62 were turned on, the voltage on the drive transistor's gate 58 would initially tend to be pulled down by the voltage on the drain of the switching transistor 62, perhaps to 1.3 V. The capacitor 54 on the drive transistor's gate 58 of the drive transistor 56 would then tend to reduce the voltage drop experienced. If the switching transistor 62 were turned "ON" and never turned "OFF," the voltage on the gate 58 of the drive transistor 56 would eventually reattain 1.4 V due to the controlling circuit's effect. For a typical output driver compensation circuit, however, the switching transistor 62 is not left "ON," but is repeatedly switched "ON" and "OFF." This toggling "ON" and "OFF" results in a square wave signal on constant voltage signal lines envg<6> 60 which eventually reaches a DC average of 1.4 V, toggling, for example, between 1.35 V and 1.45 V.

These variances in the voltage level of constant voltage signal lines envg<6> 60 result in variances in the output signal power which can result in signal transmission errors. As a result, part specifications are used to identify the maximum allowable variance for reliable operation. For example, the specifications for the RDRAM 288MD-40-800, referenced previously, require that the voltage level on the drive transistor's gate 58 have less than a 50 mV variance. To reduce the variance of the drive transistor's gate 58 voltage to less than 50 mV requires a substantial capacitor 54 (approximately 15 times the physical size of the associated drive transistor 56) coupled to each envg< > signal line. Where semiconductor space or "real estate" is precious, such a large capacitor for each output consumes a significant portion of the space available. It is therefore desirable to have an output drive circuit with minimal voltage variance without using such a large capacitor.

BRIEF SUMMARY OF THE INVENTION

The present invention provides an output driver circuit for a semiconductor device, the output driver circuit including a plurality of compensating circuits which are capable of maintaining minimal variance in the drive transistor gate voltages without the use of excessively large capacitors. According to a first aspect of the present invention, a capacitor is coupled to the gate of a drive transistor and to a signal voltage. This signal voltage is established such that it opposes the voltage shift caused by switching the switching transistor "ON." By referencing the compensating capacitor to such a signal voltage, smaller capacitor sizes are needed to obtain the results offered by large capacitors referenced to ground. An additional capacitor may also be referenced to ground to provide additional compensation during the transitions of the switching transistor and the signal voltage.

According to a second aspect of the present invention, the voltage compensation provided to the gate of the drive transistor is added in phases, one portion at a time, to smooth out the response to the compensation correction. In one embodiment, rather than applying the compensation all at once, the compensation is added in two portions or phases. In another embodiment, the compensation is added in three phases. In yet another embodiment, the compensation is further supplemented with an additional capacitor referenced to a ground potential. In yet another embodiment, transistors having relatively long effective channel lengths are used to cause a delayed compensation to provide a fourth phase of compensation.

According to a third aspect of the present invention, existing output drivers are reworked to meet application specifications by reconnecting existing transistors within the semiconductor die to enable narrower specification parameters without large capacitors.

An electronic system is disclosed comprising a processor, a memory device, an input, an output and a storage device, at least one of which includes an output driver circuit with a compensating circuit having at least one capacitor coupled between the gate of a drive transistor and a signal voltage.

A semiconductor wafer is also disclosed including an output driver circuit according to one or more embodiments of the present invention.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to several drawings herein, wherein:

DETAILED DESCRIPTION OF THE INVENTION

Figure 1:
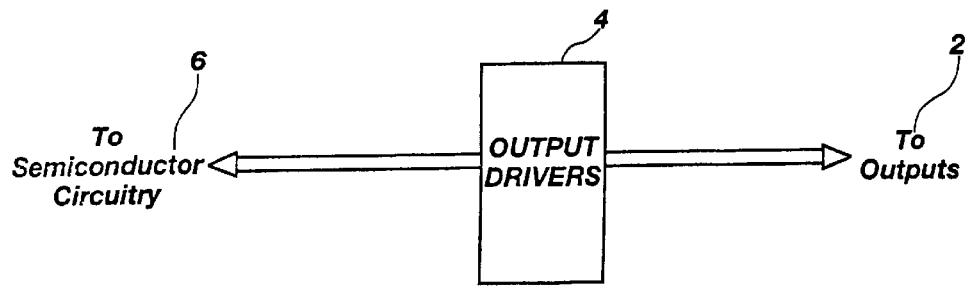
FIG. 1 is a simplified block diagram of a prior art semiconductor device output.
Figure 2:
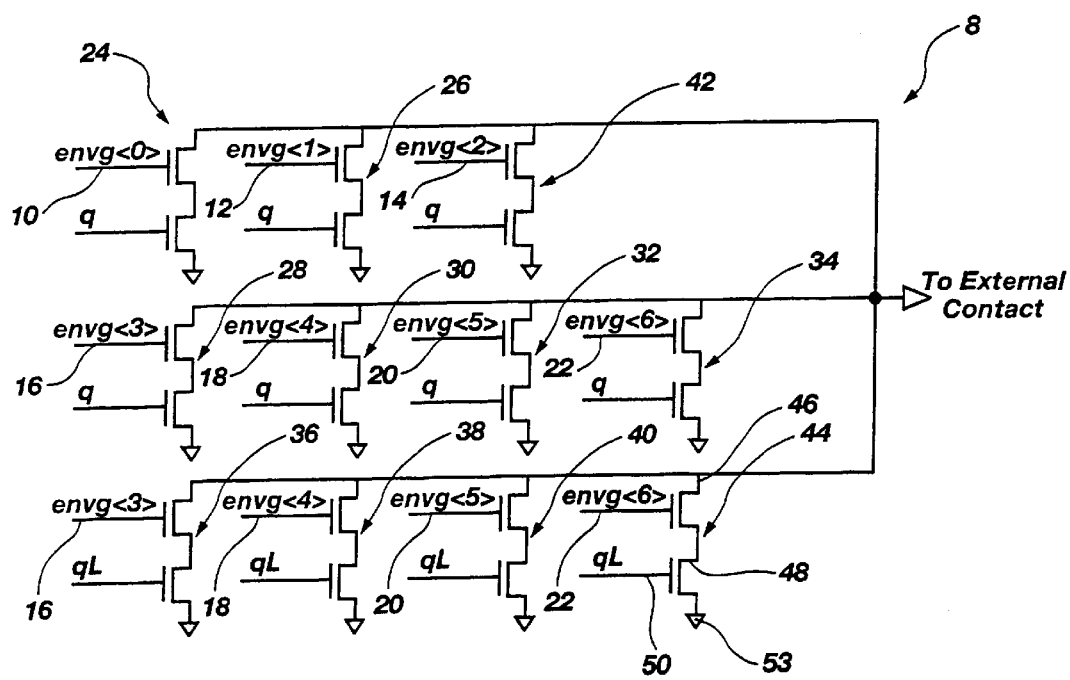
FIG. 2 is a circuit diagram of a prior art output driver circuit array.
Figure 3:
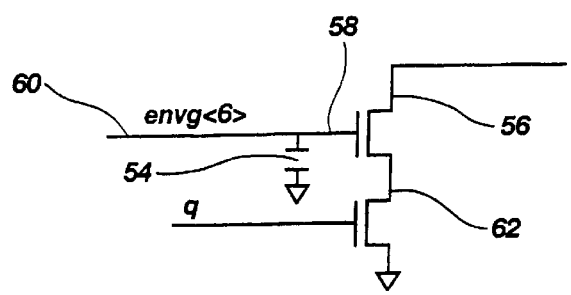
FIG. 3 is a circuit diagram of a prior art compensating circuit of an output driver circuit.
Figure 4:
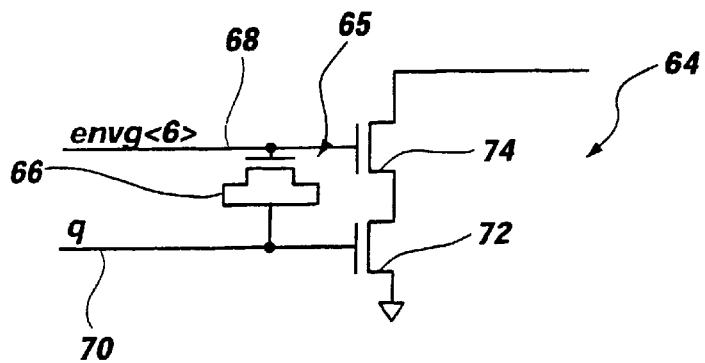
FIG. 4 is a circuit diagram illustrating a compensating circuit of a first embodiment of the present invention.

FIG. 4 is a circuit diagram of an output driver leg circuit 64 of an output driver circuit according to a first embodiment of the invention. According to an embodiment of the present invention, rather than coupling a compensating capacitor between the signal line envg<6> 68 and a ground reference voltage, as is conventionally done in the art, a support circuit 65 is coupled between the signal line envg<6> 68 and the signal voltage (q) line 70 for switching the switching transistor 72 "ON" which turns the drive transistor 74 "ON." For this first embodiment shown in FIG. 4, the support circuit 65 includes a capacitor 66. It will be understood by one of ordinary skill in the art that the capacitor 66 shown in FIG. 4, and in other figures herein, is a transistor with its drain and source terminals coupled together in such a way that it responds as a capacitor. As used herein, "capacitor" is intended to mean any capacitive element, including, without limitation, transistors configured as capacitors, dedicated capacitors, and other devices of a capacitive nature. By coupling a capacitor 66 between the signal voltage (q) line 70 and the signal line envg<6> 68, a significantly smaller capacitance is required to support the signal line envg<6> 68 voltage against being pulled down by the switching transistor 72 being turned "ON." In operation, as the signal voltage q is provided on signal voltage (q) line 70 to switch "ON" the switching transistor 72 and, thus, activate the drive transistor 74, the charge stored on the capacitor 66 pushes up against the voltage on signal line envg<6> 68 as the connection to ground through the switching transistor 72 pulls down on the voltage on signal line envg<6> 68 through the gate of drive transistor 74.

Figure 5:
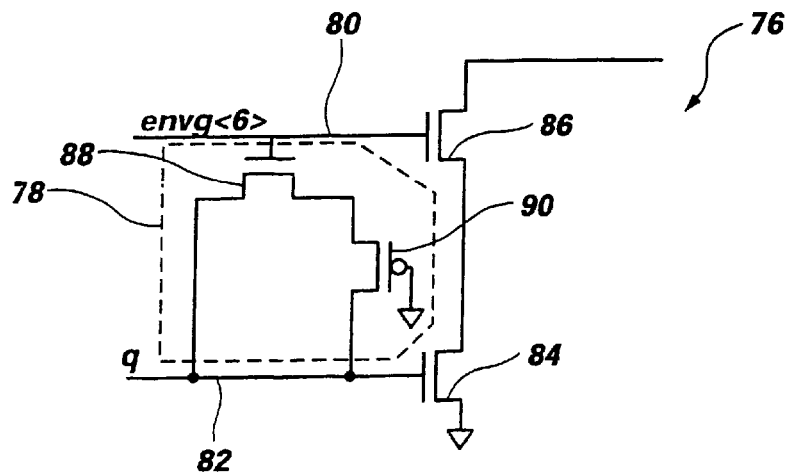
FIG. 5 is a circuit diagram illustrating a compensating circuit of a second embodiment of the present invention.

FIG. 5 is a circuit diagram of a compensating circuit 76 of an output driver circuit according to a second embodiment of the invention. In the embodiment shown in FIG. 5, a support circuit 78 is placed between the signal line envg<6> 80 and the signal voltage (q) line 82 used to turn "ON" the switching transistor 84 to initiate the drive transistor 86. In this embodiment, however, the support circuit 78 comprises two transistors 88 and 90 to apply the voltage support in two separate phases rather than all at once. In operation, when the signal voltage q is provided on the signal voltage (q) line 82 to switch on the switching transistor 84 and, thus, activate the drive transistor 86, the initial phase of the support is provided to the signal line envg<6> 80 through the transistor 88 directly coupled between the signal line envg<6> 80 and the signal voltage (q) line 82. The second phase of the support is provided to the signal line envg<6> 80 through the p-channel transistor 90 coupled between the signal voltage (q) line 82 and the transistor 88 coupled directly to the signal line envg<6> 80. Because of the phasing delays in compensation caused by placing a p-channel transistor 90 between the transistor 88 and the signal voltage (q) line 82, the compensation through that leg of the support circuit 78 is slower than with the first phase.

One factor affecting the response of the voltage level on the signal line envg<6> 80 to the added support, and to the signal line envg<6> 80 being pulled toward ground by the switching transistor 84 turning "ON," is that there is a delay in the voltage on the signal line envg<6> 80 being pulled down from the time the signal voltage q is applied to the signal voltage (q) line 82. If too much support is applied to the signal voltage (q) line 82 before the voltage has been fully affected by the switching of the switching transistor 84, the signal line envg<6> 80 may be over-supported, causing more variance in the signal line envg<6> 80 voltage. Applying support to the signal line envg<6> 80 in phases rather than all at once allows for a smoother response to the added support and, thus, a more steady voltage level on the signal line envg<6> 80.

Figure 6:
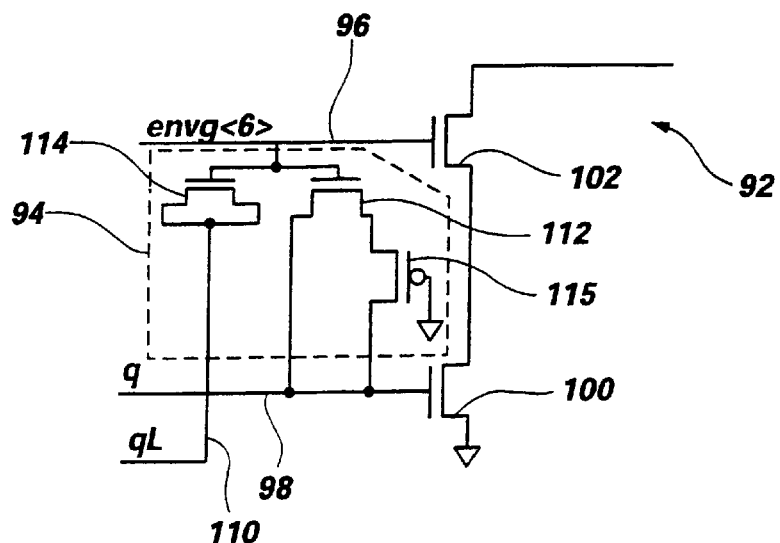
FIG. 6 is a circuit diagram illustrating a compensating circuit of a third embodiment of the present invention.
Figure 7:
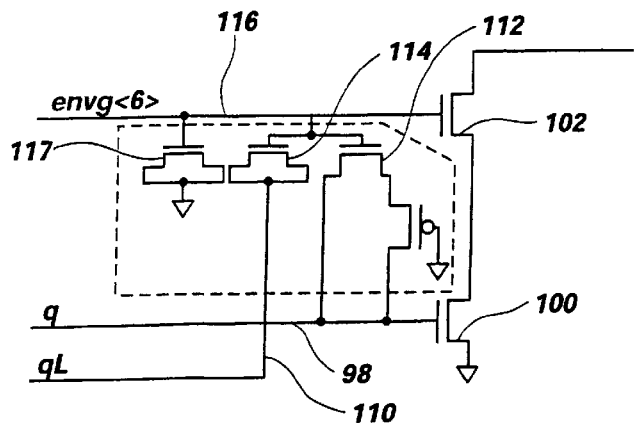
FIG. 7 is a circuit diagram illustrating a compensating circuit of a fourth embodiment of the present invention.

FIG. 6 is a circuit diagram of a compensating circuit 92 of an output driver circuit according to a third embodiment of the invention. In the embodiment shown in FIG. 6, a support circuit 94 is placed between the signal line envg<6> 96, a first signal voltage (q) line 98 used to turn on the switching transistor 100 to initiate the drive transistor 102 and a second signal voltage (qL) line 110. In this embodiment, however, the support circuit 94 comprises three transistors 112, 114 and 115 to apply the support in three separate phases rather than all at once. For this embodiment, a signal voltage q is applied to the first signal voltage (q) line 98 and a signal voltage qL is applied to the second signal voltage (qL) line 110. The first phase of support is provided through the transistor 112 coupled directly to both the signal line envg<6> 96 and the first signal voltage (q) line 98. The second phase of support is provided through the transistor 114 coupled directly to both the signal line envg<6> 96 and the second signal voltage (qL) line 110. The third phase of support is provided through the p-channel transistor 115 and the transistor 112 coupled between the signal line envg<6> 96 and the first signal voltage (q) line 98. Additionally, as shown with respect to a fourth embodiment in FIG. 7, a capacitive element in the form of a transistor 117 may also be added between the signal line envg<6> 116 and a ground reference to provide support for the voltage on that signal line to further enhance the support provided.

As will be clear to one of ordinary skill in the art from the embodiments shown thus far, any number of support phases may be used to support the voltage on a signal line in different phasing steps rather than all at once. By supporting the voltage on the envg< > signal line in phasing steps, the response of the voltage level to switching on the switching transistor is smoother and less likely to spike or dip. Furthermore, by placing at least a portion of the supporting elements between the signal line and a reference voltage, smaller capacitances are required than when coupling the supporting elements to ground.

Another aspect of the invention, which provides another phasing dimension to the phases previously described herein, is selection of the effective channel length of the capacitors or transistors used to support the envg< > signal lines. The effective channel length of the capacitors and transistors used to support the envg< > signal lines impacts the smoothness of the compensating corrections. For example, the shorter the effective channel length of a transistor or capacitor, the faster compensation at one end of the channel affects the voltage at the other end of the channel. Conversely, the longer the effective channel length of the transistor or capacitor, the slower compensation at one end of the channel affects the voltage at the other end. By determining, through simulation and/or experiment, the capacitive support and timing required to best and most smoothly support the voltage on the signal lines envg< >, an appropriate effective channel length may be determined by one of ordinary skill in the art. The surrounding circuitry and particular semiconductor material used will affect the timing and support needed for a given application. One of ordinary skill in the art will be able to make the needed calculations for a particular application.

As will also be clear to one of ordinary skill in the art, one or more embodiments of supporting circuitry may be included on each output driver leg circuit of an output driver circuit, or it may be preferable in some applications to include no forms of supporting circuitry on a particular output driver leg circuit. For example, because the output driver leg circuit transistors become respectively smaller in physical size, by half, than the preceding transistor in a series of output driver leg circuits, the voltage support added by each of these circuit transistors similarly becomes respectively smaller. Because the physically smaller transistors have, respectively, a smaller effect on the overall voltage when they are switched in as support, phase compensation of smaller transistor support may not be necessary or desired in a particular application. As with determining the timing required for adequate support of the voltage on the voltage (q) signal lines, which support circuits need phased support configurations may readily be determined by one of ordinary skill in the art. If multiple phases of compensation are not needed, one or more capacitive elements coupled between the signal line envg< > and a grounded reference is sufficient.

Figure 8:
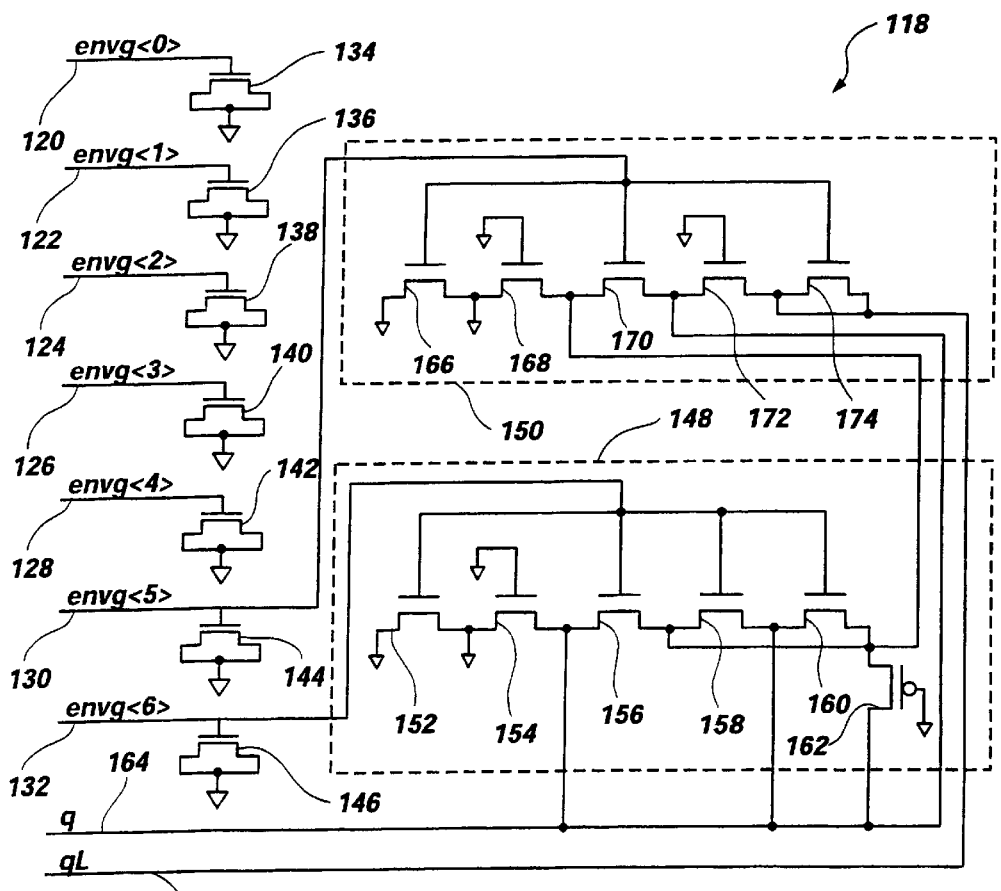
FIG. 8 is a circuit diagram illustrating an output driver circuit which has been reworked to include an embodiment of the present invention.

The present invention may also be incorporated into existing output driver circuits. FIG. 8 shows an embodiment of the present invention wherein existing circuitry on a semiconductor die was modified to meet a higher standard of voltage maintenance on the signal lines envg< >. As shown in FIG. 8, an output driver circuit compensating array 118 is provided having a plurality of signal lines envg<0> through envg<6> 120, 122, 124, 126, 128, 130 and 132. Before modification, the compensating array 118 included only a plurality of capacitive elements 134, 136, 138, 140, 142, 144 and 146 coupled between the signal lines envg<0> through envg<6> 120, 122, 124, 126, 128, 130 and 132 and ground.

To improve the ability of the compensating array 118 to control and smooth the voltage response on each envg< > signal line to switching "ON" driving transistors, support circuitry 148 and 150 was added. The first support circuitry 148 is coupled primarily to signal line envg<6> 132 and includes a modified array of transistors 152, 154, 156, 158 and 160 and one p-channel transistor. Modifying the existing array of transistors 152, 154, 156, 158 and 160 to provide support to the voltage on signal line envg<6> 132 in phases permits voltage variance parameters narrower than previously accomplished using the same existing circuitry.

The existing array of transistors 152, 154, 156, 158 and 160 has been modified, in this example, to provide two primary phases of support in addition to the support provided by the capacitive element 146 coupled between signal line envg<6> 132 and ground. For the first transistor array: a first transistor 152 is modified to be entirely coupled between signal line envg<6> 132 and ground; a second transistor 154 has its gate grounded so as to be ineffective; a third transistor 156 is coupled between the signal line envg<6> 132, a first signal voltage (q) signal line 164 and the drain of the p-channel transistor 162 which is also coupled to the first signal voltage (q) signal line 164; and a fourth transistor 158 and a fifth transistor 160 are each coupled in parallel with the third transistor 156. The second support circuitry 150 includes a second transistor array with a plurality of transistors 166, 168, 170, 172 and 174 and is modified to provide phased support to the voltage of signal line envg<5> 130. In the second transistor array: a first transistor 166 is coupled between signal line envg<5> 130 and ground; a second transistor 168 and a fourth transistor 172 have their gates grounded so as to be ineffective; a third transistor is coupled between the signal line envg<5> 130, the drain of the p-channel 162, and the first signal voltage (q) signal line 164; and a fifth transistor 174 is coupled between the signal line envg<5> 130 and voltage (qL) signal line 176. As described in conjunction with previous embodiments, coupling the transistors between a voltage line, such as first signal voltage (q) signal line 164 and voltage (qL) signal line 176, and a signal line envg< > reduces the physical size and capacity of the capacitor required to meet a particular set of specifications, and phasing the support smooths the response of the voltage transitions caused by switching in the supporting circuitry.

Figure 9:
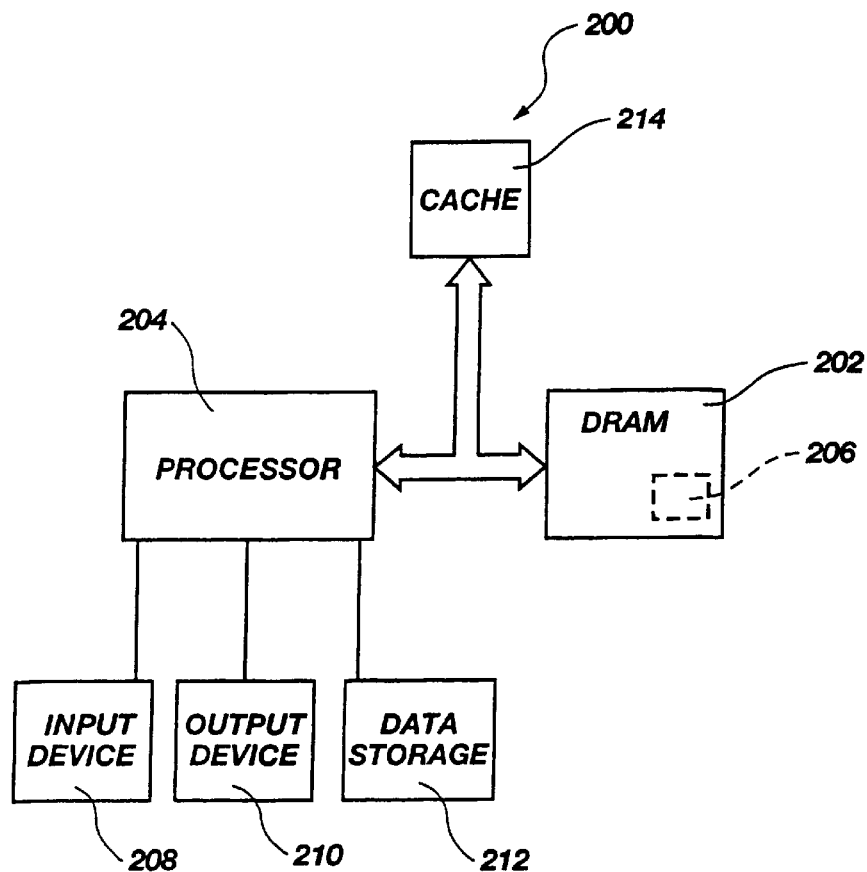
FIG. 9 is a block diagram of an electronic system including an output driver circuit according to an embodiment of the present invention.

FIG. 9 is a block diagram of an electronic system 200 which includes components having one or more output driver circuits 206 configured according to one or more embodiments of the present invention. The electronic system 200 includes a processor 204 for performing various computing functions, such as executing specific software to perform specific calculations or tasks. Additionally, the electronic system 200 includes one or more input devices 208, such as a keyboard or a mouse, coupled to the processor 204 to allow an operator to interface with the electronic system 200. The electronic system 200 also includes one or more output devices 210 coupled to the processor 204, such output devices including such outputs as a printer, a video terminal or a network connection. One or more data storage devices 212 are also conventionally coupled to the processor 204 to store or retrieve data from external storage media (not shown). Examples of conventional storage devices 212 include hard and floppy disks, tape cassettes, and compact disks. The processor 204 is also conventionally coupled to a cache memory 214, which is usually static random access memory ("SRAM"), and to dynamic random access memory (DRAM) 202. It will be understood, however, that the one or more output driver circuits 206 configured according to one or more of the embodiments of the present invention are incorporated into one or more of the cache memory, DRAM, input, output, data storage and processor devices 214, 202, 208, 210, 212, and 204.

Figure 10:
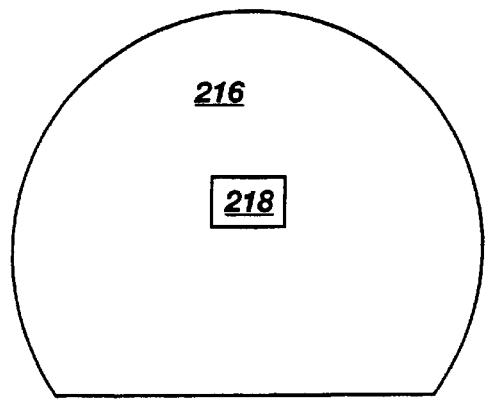
FIG. 10 is a diagram of a semiconductor wafer having at least one output driver circuit configured according to an embodiment of the present invention.

As shown in FIG. 10, an output driver circuit 218 may be fabricated on the surface of a semiconductor wafer 216 of silicon, gallium arsenide, or indium phosphide in accordance with one or more embodiments of the present invention. One of ordinary skill in the art will understand how to adapt such designs for a specific chip architecture or semiconductor fabrication process. Of course, it should be understood that the output driver circuit 218 may be fabricated on other semiconductor substrates such as a Silicon-on-Insulator (SOI) substrate, a Silicon-on-Glass (SOG) substrate, a Silicon-on-Sapphire (SOS) substrate, or other semiconductor material layers on supporting substrates, and that the term "wafer" as employed herein, is specifically intended to encompass such other substrates.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. An output driver circuit having at least one output driver leg circuit associated therewith, the at least one output driver leg circuit comprising:
   at least one drive transistor;
   at least one switching transistor coupled to both the at least one drive transistor and at least a first voltage signal line; and
   a support circuit coupled to a gate of the at least one drive transistor and to the at least a first voltage signal line, the support circuit including at least a first support element having an effective channel length based, at least in part, on at least a first time when voltage support is needed relative to a beginning of an activated cycle of the at least one drive transistor.

2. The output driver circuit of claim 1, wherein the effective channel length of the at least a first support element is longer than an effective channel length of the at least one drive transistor.

3. The output driver circuit of claim 1, wherein the support circuit further comprises a switching element coupled to the gate of the at least one drive transistor and controlled during the activated cycle of the at least one drive transistor by at least one switching voltage other than ground.

4. The output driver circuit of claim 3, wherein the support circuit further comprises a switching transistor coupled to the switching element with the at least one switching voltage coupled to the switching transistor.

5. The output driver circuit of claim 4, wherein the support circuit further comprises a second support element coupled to the at least a first support element and the at least one switching voltage, the second support element having an effective channel length based, at least in part, on at least a second time when voltage support is needed relative to the beginning of the activated cycle of the at least one drive transistor.

6. The output driver circuit of claim 5, wherein the support circuit further comprises a third support element coupled to the gate of the at least one drive transistor and to at least a second switching voltage different from the at least one switching voltage, the third support element having an effective channel length based, at least in part, on at least a third time when voltage support is needed relative to the beginning of the activated cycle of the at least one drive transistor.

7. The output driver circuit of claim 1, wherein the support circuit further comprises at least another support element coupled to the gate of the at least one drive transistor and a ground potential, the at least another support element having an effective channel length based, at least in part, on at least another time when voltage support is needed relative to the beginning of the activated cycle of the at least one drive transistor.

8. A support circuit for smoothing a response of a voltage on a gate of a drive transistor of an output driver circuit, comprising:

a first support element for coupling to the gate of the drive transistor and to at least one switching voltage, the first support element having an effective channel length based, at least in part, on at least a first time when voltage support is needed relative to a beginning of an activated cycle of the drive transistor; and a second support element coupled to the first support element and the at least one switching voltage, the second support element having an effective channel length based, at least in part, on at least a second time when voltage support is needed relative to the beginning of the activated cycle of the drive transistor.

9. The support circuit of claim 8, further comprising a third support element coupled to the gate of the drive transistor and to at least a second switching voltage different from the at least one switching voltage, the third support element having an effective channel length based, at least in part, on at least the second time when voltage support is needed relative to the beginning of the activated cycle of the drive transistor.

10. The support circuit of claim 9, further comprising at least another support element coupled to the gate of the drive transistor and a ground potential, the at least another support element having an effective channel length based, at least in part, on at least another time when voltage support is needed relative to the beginning of the activated cycle of the drive transistor.

11. An electronic system comprising:

a processor; and at least one of an input device, an output device, a memory device and a data storage device associated with the processor;

wherein at least one component of the electronic system comprises an output driver circuit including a drive transistor having a support circuit associated therewith, the support circuit including at least one support element for coupling to a gate of the drive transistor and to at least one switching voltage, having an effective channel length based, at least in part, on at least a first time when voltage support is needed relative to a beginning of an activated cycle of the drive transistor.

12. The electronic system of claim 11, further comprising a second support element coupled to the at least one support element and the at least one switching voltage, the second support element having an effective channel length based, at least in part, on at least a second time when voltage support is needed relative to the beginning of the activated cycle of the drive transistor.

13. The electronic system of claim 12, wherein the support circuit further comprises at least another support element coupled to the gate of the drive transistor and a ground potential, the at least another support element having an effective channel length based, at least in part, on at least another time when voltage support is needed relative to the beginning of the activated cycle of the drive transistor.

\* \* \* \* \*

UNITED STATES PATENT AND TRADEMARK OFFICE
CERTIFICATE OF CORRECTION

PATENT NO.          : 6,605,968 B2                                        Page 1 of 1
APPLICATION NO. : 10/218258
DATED                  : August 12, 2003
INVENTOR(S)        : Brian W. Huber and David Lisenbe It is certified that error appears in the above-identified patent and that said Letters Patent is hereby corrected as shown below:

In the specification:
    COLUMN 2,    LINE 14,    change "envg< >" to --envg<> --
    COLUMN 3,    LINE 20,    change "envg< >" to --encg<> --

Signed and Sealed this

Eleventh Day of December, 2007

JON W. DUDAS
*Director of the United States Patent and Trademark Office*